US005642813A

United States Patent [19]
Nyseth

[11] Patent Number: 5,642,813
[45] Date of Patent: Jul. 1, 1997

[54] WAFER SHIPPER AND PACKAGE

[75] Inventor: David L. Nyseth, Plymouth, Minn.

[73] Assignee: Fluoroware, Inc., Chaska, Minn.

[21] Appl. No.: 628,862

[22] Filed: Apr. 5, 1996

Related U.S. Application Data

[62] Division of Ser. No. 276,096, Jul. 15, 1994, Pat. No. 5,575,394.

[51] Int. Cl.$^6$ .................................................. B65D 19/00
[52] U.S. Cl. ........................ 206/597; 206/710; 206/723; 206/832; 206/523
[58] Field of Search ............................ 206/4.54, 707, 206/710, 711, 722, 723, 523, 520, 821, 832, 597; 220/4.21, 306, 212.5, 771

[56] References Cited

U.S. PATENT DOCUMENTS

| | | | |
|---|---|---|---|
| 3,311,231 | 3/1967 | English, Jr. | 206/523 |
| 3,416,695 | 12/1968 | Bessett et al. | 206/520 |
| 5,207,727 | 5/1993 | Pearce et al. | 206/821 |
| 5,575,394 | 11/1996 | Nyseth | 206/454 |

OTHER PUBLICATIONS

Siltec News, vol. 7, No. 2, Aug. 1991.

*Primary Examiner*—David T. Fidei
*Attorney, Agent, or Firm*—Palmatier, Sjoquist, Helget & Voigt, PA

[57] ABSTRACT

A plastic container for storing and shipping semiconductor wafers comprising a wafer carrier of substantially rigid and transparent material supporting the wafers and maintaining the wafers in spaced relation to each other, top and bottom covers for the wafer carrier formed of stiff but resiliently flexibly yieldable material, the wafer carrier having upper and lower enlarged rim portions extending around the peripheries of the top and bottom of the wafer carrier and being embraced by enlarged peripherally extending rim portions of the top and bottom covers, the top and bottom covers having partially cylindrical panels with elongate beads or ridges formed thereon to engage and maintain the edges of the wafers spaced from the partially cylindrical surfaces, offset tabs on the wafer carrier and top and bottom covers facilitating of flexibly lifting small portions of the covers off the wafer carriers and then progressively disengaging the covers from the wafer carriers; a package comprising a multiplicity of cover trays with compartments receiving the shipping containers therein, the cover trays supporting the containers at the tab portions on the wafer carriers and the cover trays also bearing downwardly on the side edge portions of the cover to maintain the covers in closed condition on the wafer carrier.

19 Claims, 6 Drawing Sheets

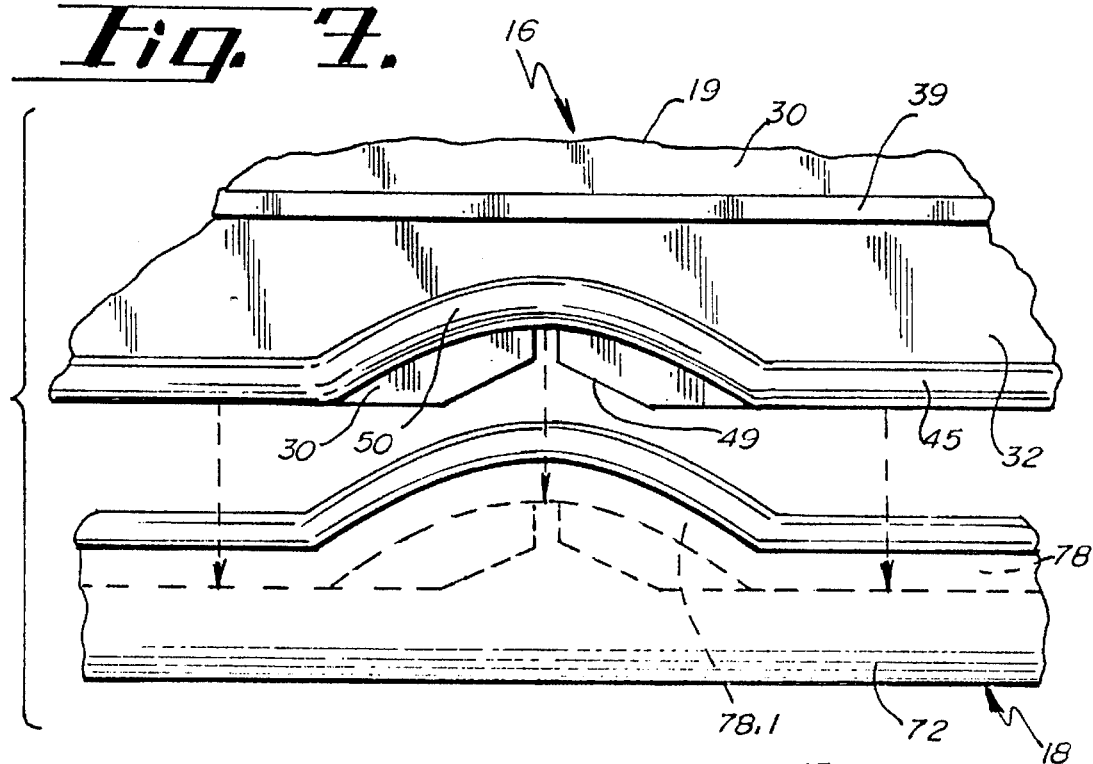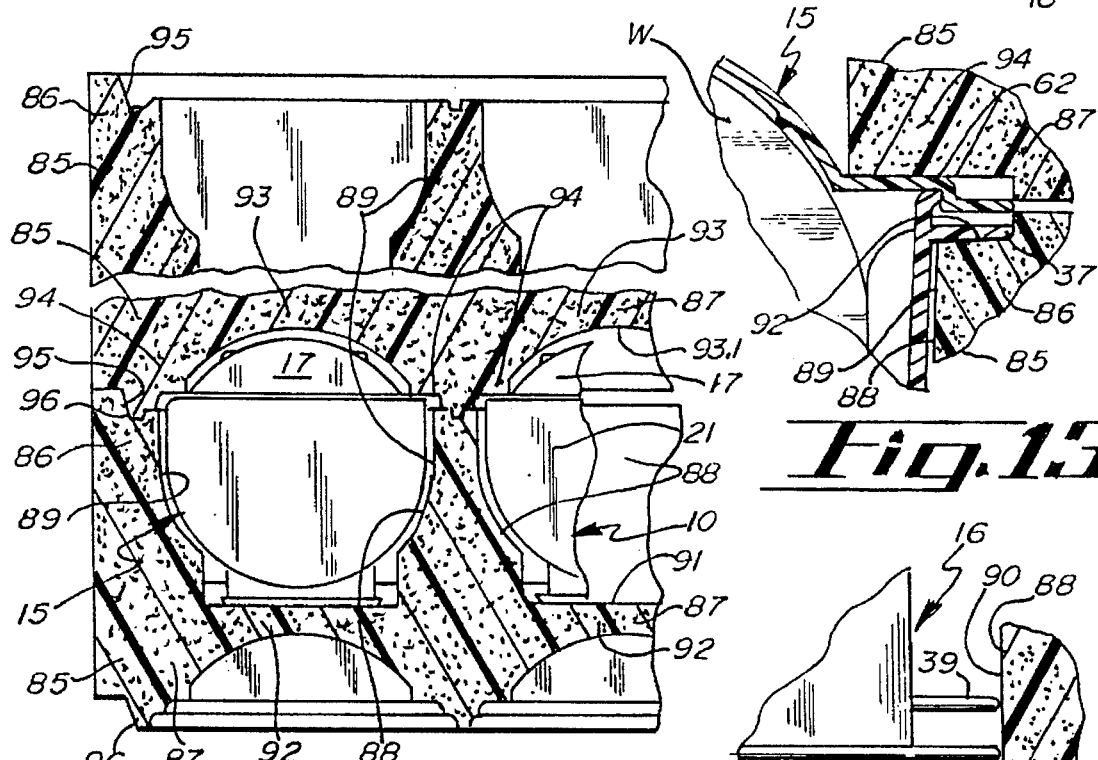

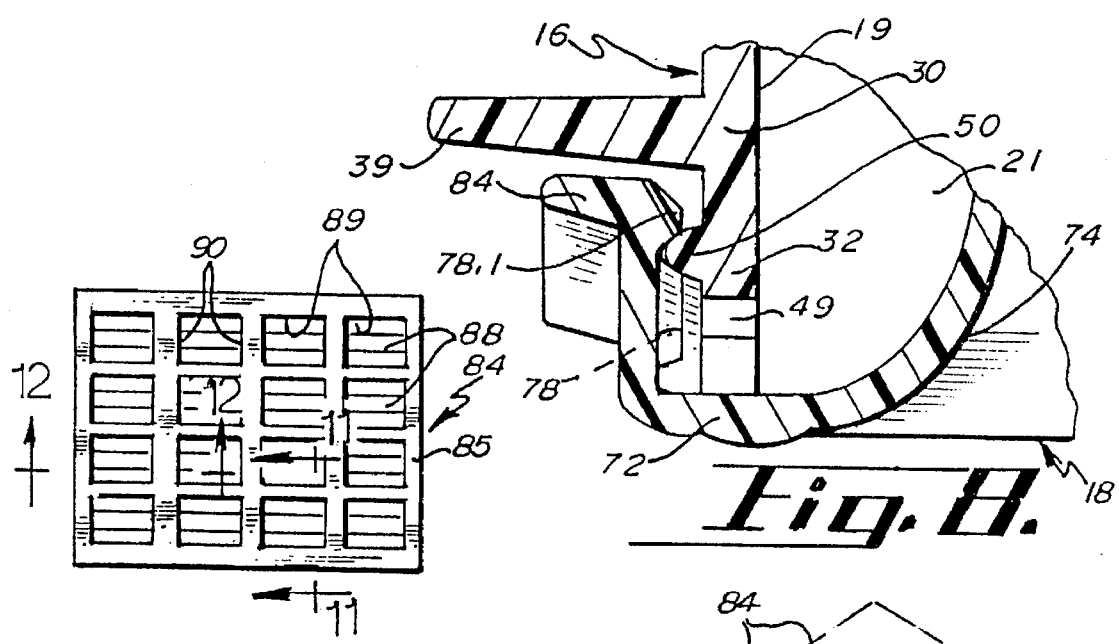
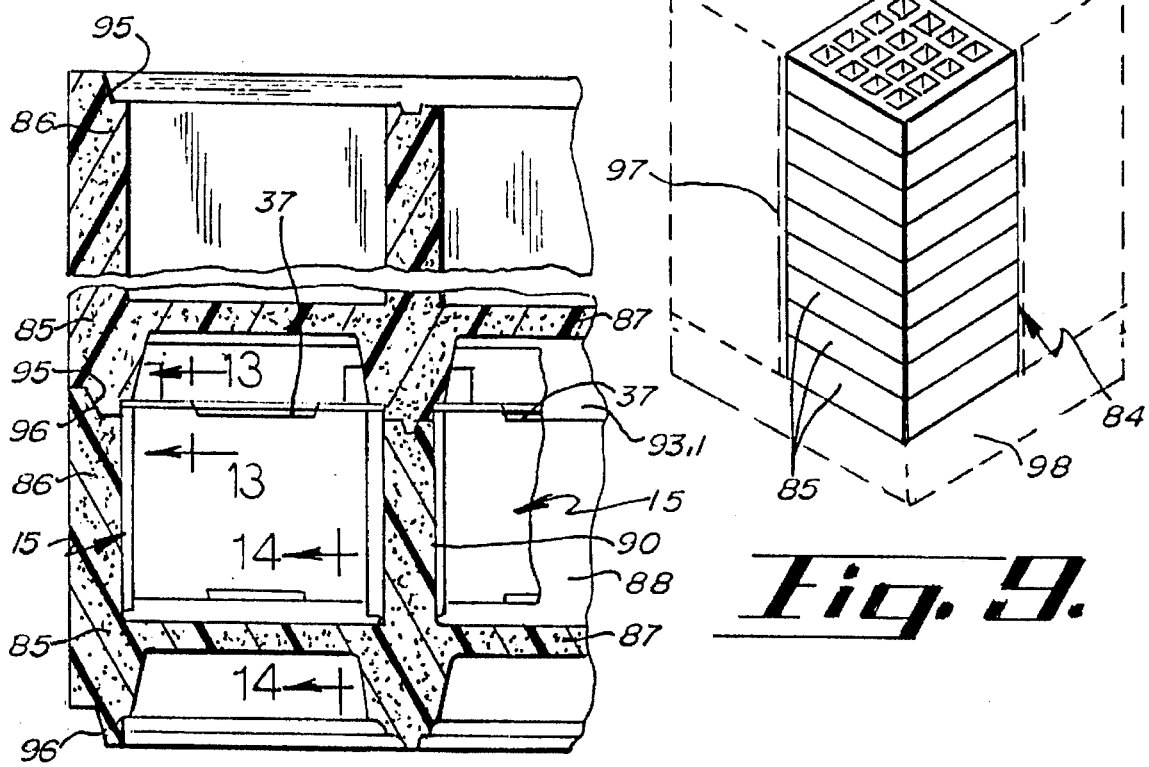

WAFER SHIPPER AND PACKAGE

This application is a divisional application of WAFER SHIPPER AND PACKAGE filed Jul. 15, 1994, Ser. No. 08/276,096, now U.S. Pat. No. 5,575,394.

This invention relates to containers and packages for shipping semiconductor wafers and similar objects.

BACKGROUND OF THE INVENTION

Semiconductor wafers are subjected to numerous steps in their processing. The wafers are subjected to various process steps in various machines and at various locations. The wafers must be transported from place to place and stored over a period of time in order to accommodate the necessary processing. Numerous types of shipping devices have been previously known for wafer carriers and in the past, the principal effort has been to protect the semiconductor wafers against physical damage. Such shipping containers and packages have been previously known as disclosed in U.S. Pat. Nos. 4,248,346; 4,557,382; 5,253,755; and 5,273,159. Those devices which utilize wafer carriers which are suitable for handling the wafers during actual processing of the wafers have not provided any degree of sealing to protect wafers against contamination due to moisture, various atmospheric conditions and particulates.

SUMMARY OF THE INVENTION

An object of the invention is to provide a shipping container for safely storing large sized semiconductor wafers and to minimize likelihood of contamination of the wafers with particulate, moisture or other contaminating mediums.

A feature of the invention is a wafer carrier with an open top and an open bottom and wafer separating ribs on the sidewalls, all of the sidewalls and end walls being uniformly of full height and one of the end walls having an external transverse indexing crossbar to accommodate locating the carrier in processing equipment. The top and bottom edges of the sidewalls and end walls substantially lie in planes to facilitate application of top and bottom covers to the carrier.

Another feature of the invention is the provision of cooperating interlocking beaded edge or rim portions on the carrier and on the sealing cover to fit together with a snap fit and produce a substantial seal to minimize any migration of airborne particulate, moisture and gases into and out of the carrier.

Still another feature provides that the sealing cover is molded of a stiff but relatively flexible plastic which allows the cover to be removed by flexing a corner portion of the cover to lift the corner portion off the carrier, and then progressively lifting other adjacent portions of the cover off the carrier. This flexing of the cover simulates peeling the cover off the carrier.

A further feature is the provision of a lifting tab on one side of the snap fit cover and a tab on an adjacent portion of the carrier as to essentially require that the cover always be lifted at said one side.

The cover, at the side opposite the tabs, relates to the adjacent top edge portion of the carrier in a hinging relation and bears downwardly against a tab portion on the carrier to lift the cover off the carrier as the cover is tilted upward.

Still another feature of the invention is a package for shipping semiconductor wafers wherein a multiplicity of shipping containers contained semiconductor wafers are stacked onto cover trays which carry the individual shipping containers in storage compartments of cover trays which underlie and overlie a number of the shipping containers which are supported on a cover tray. The shipping containers are provided with outwardly projecting tabs adjacent the top cover and the cover trays support the shipping containers by engaging and supporting the tabs which effectively suspend the container in the storage compartment. Another cover tray overlies the shipping containers in the storage compartments and bear downwardly on the edge portions of the cover to maintain the covers on the wafer carriers to maintain the sealed condition within the shipping containers.

BRIEF DESCRIPTION OF DRAWINGS

FIG. 7 is an enlarged detail elevation view showing the lower edge portion of the sidewall of the carrier and the adjacent portions of the bottom cover, in exploded condition.

FIG. 8 is an enlarged detail section view taken approximately at 8—8 of FIG. 1.

FIG. 9 is a perspective view illustrating a package for shipping a multiplicity of the shipping containers illustrated in FIGS. 1–8.

FIG. 10 is a top plan view of the stack of cover trays illustrated in FIG. 9.

FIG. 11 is a detail section view, broken away for clarity of detail and taken approximately at 11—11 of FIG. 10.

FIG. 12 is a detail section view, partly broken away for clarity of detail and taken approximately at 12—12 of FIG. 10.

FIG. 13 is an enlarged detail section view taken approximately at 13—13 of FIG. 12.

FIG. 14 is an enlarged detail section view taken approximately at 14—14 of FIG. 12.

DETAILED SPECIFICATION

Figure 1:
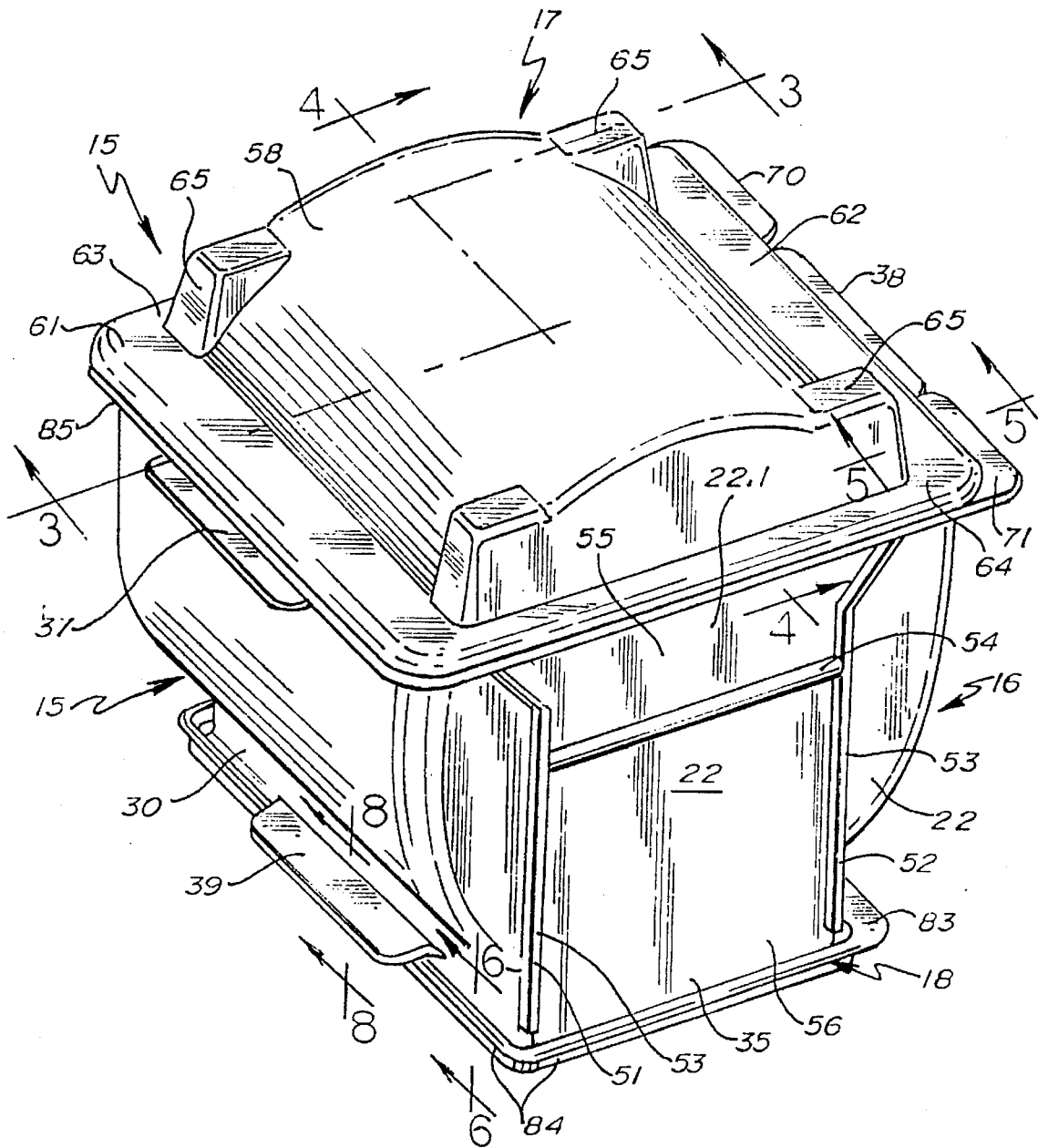
FIG. 1 is a perspective view of a plastic shipping container.
Figure 2:
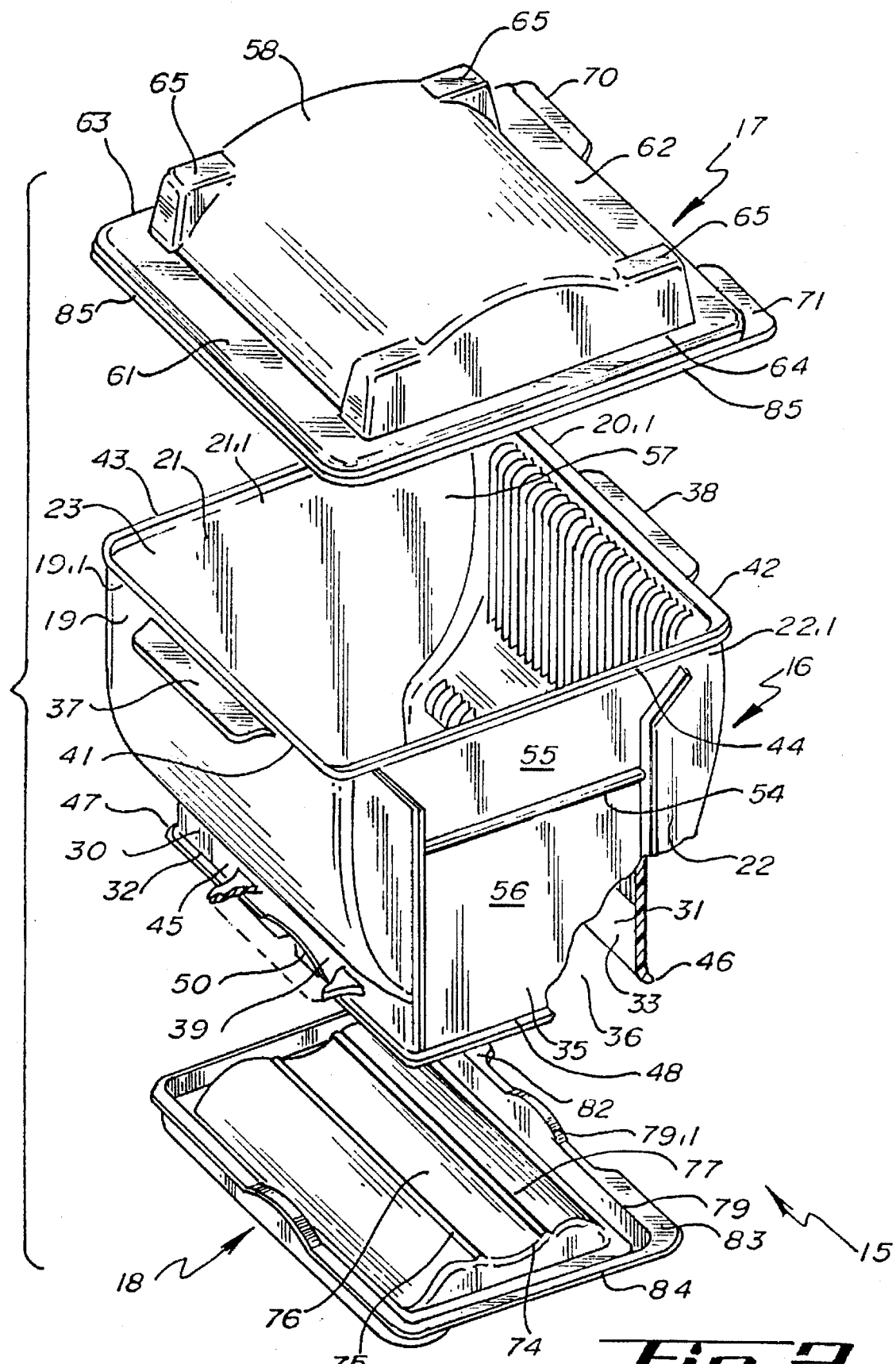
FIG. 2 is a perspective view of the shipping container in exploded condition to show the three principal parts; and having portions of the wafer carrier broken away for clarity of detail.
Figure 3:
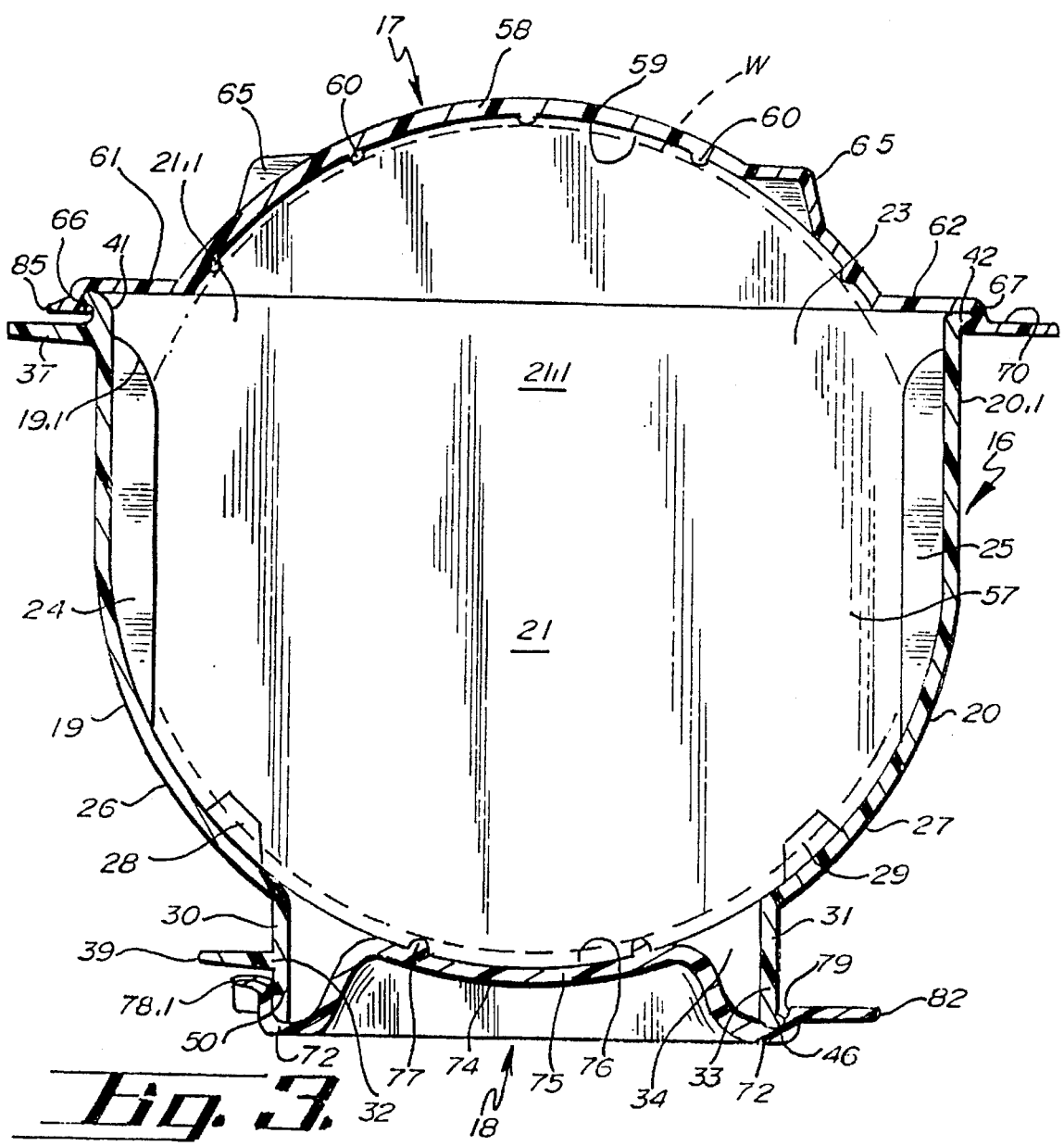
FIG. 3 is a section view through the shipping container, taken on a broken line as indicated at 3—3 in FIG. 1, and wherein the break is taken at the center line indicated by dot dash lines in FIG. 3.

The shipping container is indicated in general by numeral 15 and comprises a wafer carrier 16, a top cover 17 and a bottom cover 18.

The wafer carrier 16 is preferably molded of a substantially rigid and transparent plastic material, such as polycarbonate, although the wafer carrier might be molded of other comparable or equivalent plastics. The top cover 17 and bottom cover 18 are both molded of a substantially stiff but resiliently and flexibly yieldable plastic material, such as a thermoplastic elastomer known by its trademark Hytrel®, a registered trademark of DuPont. The Hytrel thermoplastic elastomer, in all of its grades, are block copolymers, consisting of a hard (crystalline) segment of polybutylene terephthalate and a soft (amorphous) segment based on long-chain polyether glycols. The particular material used in the top and bottom covers 17 and 18 has a hardness, durometer D in the range of 45 to 55 to 63, and the material is elastic and has a sticky tack at the surface, providing for maximum grip and minimum creep of material and a high abrasion resistance. In addition, the stiff but resiliently yieldable material in the top and bottom covers resists deterioration from many industrial chemicals, oils and solvents.

The wafer carrier 16 comprises four encompassing walls specifically identified as sidewalls 19 and 20 and end walls 21 and 22. The sidewalls 19 and 20 and end walls 21 and 22 are molded integrally of each other so that the plastic wafer carrier 15 is in one piece. The upper edge portions 19.1, 20.1, 21.1 and 22.1 of the sidewalls and end walls are in substantially linear relation to each other with respect to each other, lying in a plane and defining the top opening 23 of the carrier facilitating loading the wafers W into the wafer carrier and unloading the wafers from the wafer carrier.

The sidewalls 19 and 20 have a multiplicity of upright ribs or teeth 24 and 25 formed integrally thereof and defining pockets or slots 25.1 therebetween for receiving and retaining the semiconductor wafers W in spaced relation with each other. The transparent polycarbonate of the sidewalls 19, 20 facilitate viewing the wafers to determine their presence and location. The sidewalls 19 and 20 also have rounded offset portions 26 and 27 shaped to conform generally to the shape of the wafers W to be carried therein. The offset portions have additional wafer separating lugs 28 and 29 for maintaining the wafers W in spaced relation to each other and in quiet relation with respect to each other.

The sidewalls 19 and 20 also have depending and parallel foot panels 30 and 31 defining the lower edge portions 32 and 33 of the sidewalls 19 and 20, respectively.

End walls 21 and 22 are both substantially flat or planar and have lower edge portions 34 and 35 which are arranged generally in the same plane as the lower edge portions 32 and 33 of the sidewalls 19 and 20. The interconnected lower edge portions 32, 33, 34 and 35 of the sidewalls and end walls cooperate to define the bottom opening 36 of the carrier between the foot panels 30 and 31 in order to provide access to the wafers W at the bottom of the carrier 16.

The sidewalls 19 and 20 have outwardly protruding tabs 37 and 38 molded integrally of the upper edge portions 19.1 and 20.1 of the sidewalls, and the tabs 37 are elongate and extend longitudinally along the sidewalls, substantially midway between the ends of the sidewalls, substantially as illustrated in FIG. 1. The sidewalls 19 and 20 also have lower tabs 39 and 40 protruding outwardly from the lower edge portions 32 and 33 of the sidewalls and specifically from the foot panels 30 and 31 thereof. The tabs 39 and 40 are arranged as mirror images of each other, the tab 39 being illustrated in FIG. 1 and tab 40 being illustrated in FIG. 4 in dotted lines.

The upper and lower tabs 37–40 are particularly useful in manually lifting and handling the carrier 16 and container 15, and the upper tabs 37, 38 are also used to suspend the container 15 during storage or shipment, see FIGS. 9–14. The tabs are also useful in applying the cover 17, 18 to the carrier 16.

The upper edge portions 19.1, 20.1 of the sidewalls and the upper edge portions 21.1, 22.1 of the end walls define enlarged and outwardly flared upper rim portions 41, 42 on the sidewalls 19, 20 and rim portions 43, 44 on the end walls 21, 22, respectively. The enlarged upper rim portions 41–44 connect with each other and accordingly provide rim portions extending around the entire periphery of the carrier 16, i.e. along both sidewalls and end walls. The peripherally extending rim portions 41–44 lie substantially in a plane.

The sidewalls 19 and 20 and the end walls 21 and 22 also define enlarged and outwardly flaring lower rim portions 45, 46, 47 and 48, respectively, which join together and effectively provide lower rim portions around the entire periphery of the carrier 16. The lower rim portions lie substantially in a plane.

Figure 6:
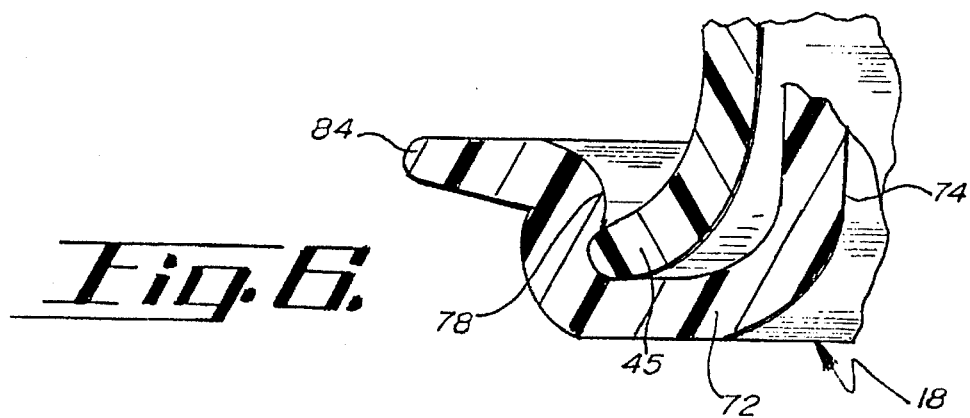
FIG. 6 is an enlarged detail section view taken approximately at 6—6 of FIG. 1.

Each of the foot panels 30 and 31 has an indexing notch 49 formed therein to cooperate with indexing ribs or media in a processing machine for accurately locating the wafer carrier 16 in such a processing machine. The two lower rim portions 45 and 46 on the foot panels 30 and 31 of the sidewalls 19 and 20 diverge upwardly as at 50 and pass over the indexing notch 49. The shape of the enlarged lower rim portion 45 illustrated in FIG. 6 illustrates the shape of all of the enlarged lower rim portions 45, 46, 47 and 48 with the exception of the portions 50 of the enlarged lower rim portion 45, 46 which diverge out of the plane of the rim portions and pass over the indexing notches 49.

It is to be particularly recognized that all portions of the end walls 21 and 22 are of substantially uniform height, and of the same height as the sidewalls 19 and 20. The end wall 22 has a pair of widely spaced support bars 51 and 52 formed integrally thereof and extending into close proximity with the upper and lower edge portions 22.1 and 35, respectively, of the end wall 22. The support bars 51 have coplanar outer edges 53 to lie on a plane surface of a processing machine for the purpose of accurately locating the wafer carrier and the wafers relative to other equipment in the processing machine. The end wall 22 also has an indexing crossbar 54 formed integrally thereof, and is sometimes referred to as an "H-bar", extending transversely of the support bars 51, 52. The indexing crossbar 54 accurate locates the wafer carrier 16 in a processing machine by cooperating with the locating mechanism thereof. While the crossbar 54 is shown to extend entirely to the support bars 51, 52, but may extend only partially across the end wall 22 between the support bars. The crossbar 54 is also formed integrally and in one piece with the end wall 22.

It is to be particularly noted that both end walls 21 and 22 have the full height which is the same as the height of the sidewalls 19, 20; and the end walls 21 and 22, as well as the sidewalls, have the enlarged upper and lower rim portions which effectively extend around the entire periphery of the carrier 16. The end wall 22 in particular has panel portions 55 and 56, which respectively extend upwardly from the indexing crossbar 54 to the enlarged upper rim portion 44, and downwardly from the indexing crossbar 54 to the enlarged lower rim portion 48, respectively. Both of the panel portions 55 and 56 fill the entire spaces between the support bars 51, 52, which are formed integrally of the end wall 22.

Both the top cover 17 and the bottom cover 18, when applied to the upper and lower portions of the carrier to respectively close the top opening 23 and bottom opening 36 thereof, establish a hermetic sealing relations with respect to the carrier to essentially prevent migration of air, moisture and contaminating particles either into or out of the open interior 57 of the carrier wherein the wafers W are stored. In addition, because both the top cover 17 and bottom cover 18 are formed or molded of a substantially stiff, but resiliently flexibly yieldable plastic material, these top and bottom covers 17, 18 may be flexed slightly during removal thereof so as to essentially peel the covers off the carrier by initially lifting one corner of the cover off the carrier and then progressively disengaging the remainder of the cover from the carrier.

Figure 4:
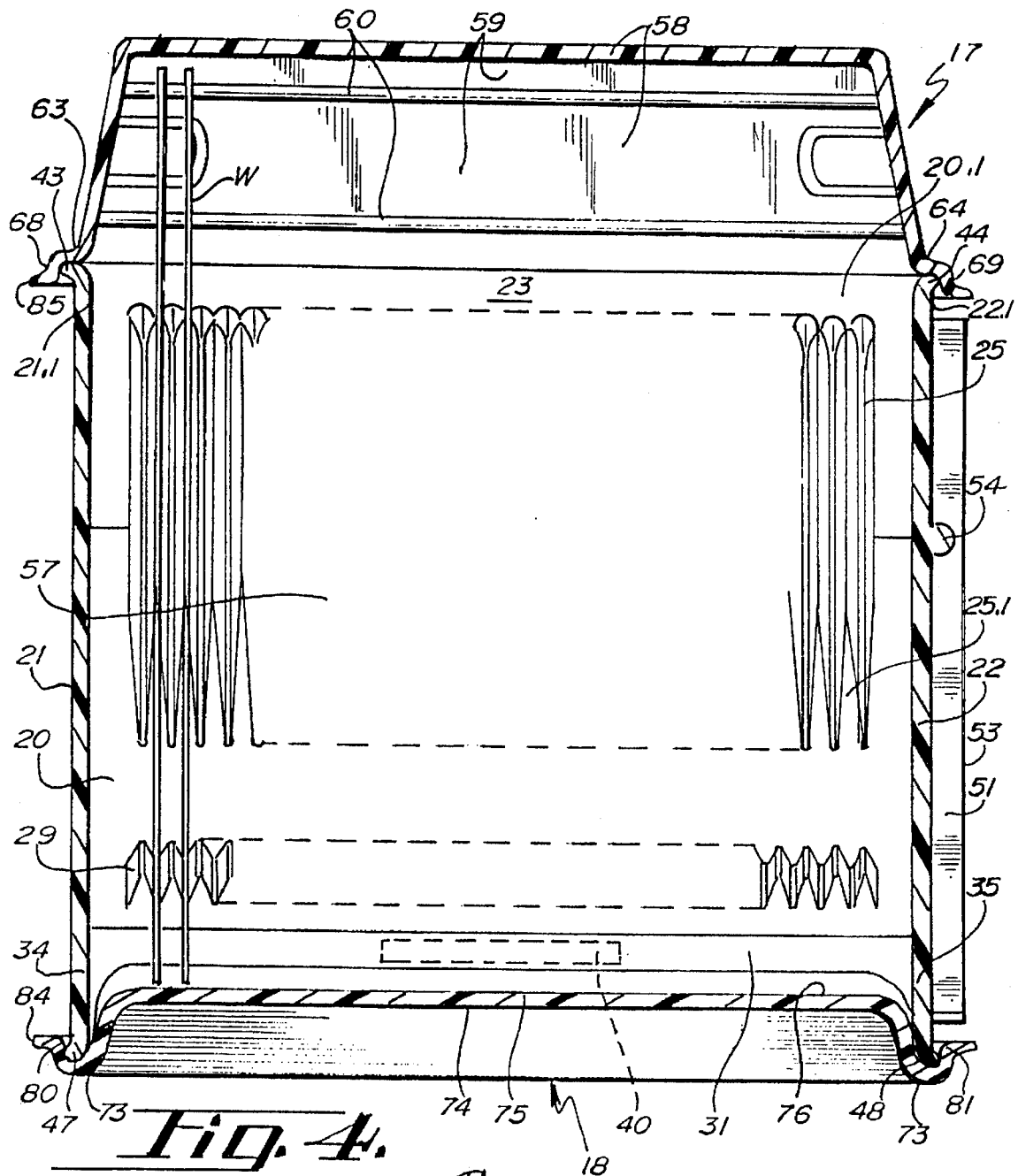
FIG. 4 is a section view taken approximately at 4—4 of FIG. 1 and showing several semiconductor wafers being stored in the container.
Figure 5:
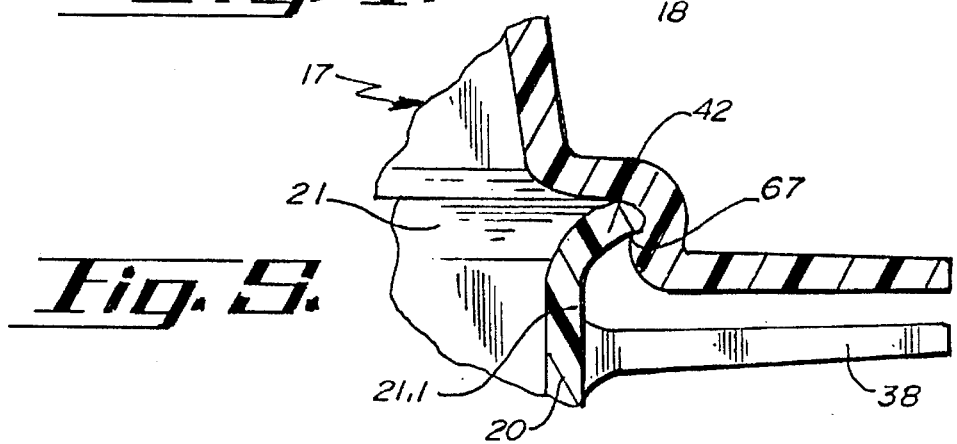
FIG. 5 is an enlarged detail section view taken approximately at 5—5 of FIG. 1.

The top cover 17 comprises a partially cylindrical panel or retainer portion 58 having the curvature substantially the same as the shape of the edges of the wafers W to be stored in the container 15. In one successful example of the container, the wafers may have a diameter of approximate eight inches (20.3 cm) and the curvature of the panel 58 appropriately substantially duplicates the curvature of the edge of panels of such size. The container 15 is also suited to store 6 inch (15 cm), twelve inch (30 cm) or larger wafers by making the container an appropriate size. The partially cylindrical panel 58 has a convex inner surface facing the open interior 57 of the wafer carrier; and the panel 58 also has a multiplicity of elongate beads or ridges 60 extending longitudinally along the partially cylindrical inner surface and protruding slightly toward the open interior 57 of the carrier to engage the edges of the wafers W and maintain a spaced relation between the edges of the wafers and the convex surface 59 of panel 58. As illustrated in FIG. 4, the elongate beads 60 extend throughout the full length of the cover 17 and of the panel 58 so as to overlie and engage all of the wafers that may be stored in the container.

The top cover 17 also has substantially flat and planar side edge portions 61, 62, 63, 64. It will be recognized that the side edge portions 61, 62, adjacent the carrier sidewalls 19 and 20, provide springiness in the cover, and are substantially wider than the end edge portions 63, 64 which are adjacent the end walls 21, 22 of the carrier. The side edge portions 61–64 lie directly on the upper edge portions 19.1, 20.1, 21.1. and 22.1 of the carrier and contribute to maintaining the hermetic seal between the carrier and the top cover.

The top cover 17 also has a multiplicity of deformations or stacking offsets 65 formed in the panel 58 to facilitate stacking of the containers one upon another.

The top cover 17 also has enlarged top cover rim portions extending around the entire periphery of the top cover and more specifically, the top cover has inwardly protruding enlarged top cover rim portions 66, 67 extending all along the side edge portions 61, 62 of the top cover; and has enlarged top cover rim portions 68, 69 extending all along the end edge portions 63, 64. All of the enlarged top cover rim portions 66, 67, 68, 69 are interconnected and formed integrally of each other and lie in a plane. When the top cover 17 is applied onto the carrier 16, the rim portions 66–69 engage and embrace the rim portions 41–44 of the carrier 16 in hermetic sealing relation. The rim portions 66–69 of the cover 17 and rim portions 41–44 of the carrier provide a snap fit for securing the cover 17 onto the carrier 16. The interfitting rim portions 66–69 on the cover and the rim portions 41–44 on the carrier 16 provide the sole means by which the cover 17 is anchored onto the carrier 16, i.e., there is no other latching devices for holding the cover 17 onto the carrier 16.

Cover 17 also has a pair of tab portions 70, 71 which protrude outwardly from the rim portion 67 and extend longitudinally along the rim portion 67 and side edge portion 62 adjacent the ends of the top cover to be in offset relation with respect to the adjacent tab 38 on the carrier 16. The tabs 70, 71 are useful in completing closing of the top cover 18 onto the carrier 16. In the final stages of applying the top cover, the tabs 70, 71 may be manually squeezed toward the tab 38 on the carrier to assure that application of the bottom cover is completed, and that the snap fit has been finished.

Although technicians using the container 16 may devise various procedures of applying and removing the top cover 17, it has been found to be successful to first place the top cover 17 upon the upper edge portions of the side and end walls. The two corners of the top cover may be pressed, initially, onto the rim portions of the side and end walls using the palm or heel of the person's hands. Then the side edge portions 61, 62 of the top cover are progressively pressed onto the rim portions 41, 42 at the sidewalls of the carrier, until the entire rim portions 66–69 of the cover have achieved and completed the snap fit onto the adjacent rim portions 41–44 of the carrier.

For removing the top cover 17, a corner portion, such as adjacent rim portions 67 and 69, are lifted off the adjacent rim portions 42, 44 of the carrier, and the corner portion of the top cover is flexed upwardly. The rim portions are progressively separated by lifting on the top cover until the cover is free of all of the rim portions 41–44 of the carrier.

The particular materials from which the carrier 16 and cover 17 are formed are highly resistant to abrading and scuffing and accordingly, the generation of particulate is minimized as the cover is lifted off or applied onto the carrier.

The bottom cover 18 has side edge portions 72 and end edge portions 73 which respectively underlie the lower edge portions 32, 33 and 34, 35 of the carrier and engage the lower edge portions of the end walls and sidewalls of the carrier to contribute materially to a hermetic sealing relation between the bottom cover 18 and the carrier 16. The bottom cover 18 has a central wafer supporting portion 74 offset with respect to the edge portions 72, 73 as to protrude upwardly into the bottom opening 36 of the carrier 16. More specifically, the wafer supporting portions 74 comprises a partially cylindrical panel 75 with a convex inner surface which faces the interior 57 of the wafer carrier and the edges of the wafers W confined therein. The curvature of panel 75 conforms to the shape of the wafers W. The panel 75 also has a pair or plurality of elongate beads or ridges 77 formed integrally thereof and protruding from the convex surface inwardly of the interior 57 of the carrier 16 as to engage and support the edges of the wafers W. The beads 77 actually lift the wafers W out of engagement with the offset portions 26, 27 of the sidewalls 19, 20 so that the wafers are free of the sidewalls and are entirely supported upon one or both of the beads 77, regardless of the location of the flat edge portions of the wafers. The elongate beads 77 extend longitudinally along the partially cylindrical panel 75 and extend substantially to the ends of the bottom cover 18.

The bottom cover also has rim portions extending around the entire periphery of the bottom cover and more specifically, the bottom cover comprises enlarged rim portions 78, 79 extending along the side edge portions 72 of the bottom cover and embracing the rim portions 45, 46 of the sidewalls 19, 20 of the carrier. The bottom cover also enlarged bottom cover rim portions 80, 81 extending along the end edge portions 73 of the bottom cover and embracing the enlarged rim portions 47, 48 of the end walls of the carrier 16. The rim portions 78, 79, 80 and 81 are all interconnected with each other and lie substantially in a plane and embrace the rim portions 45, 46, 47 and 48 of the wafer carrier in a snap fit and in hermetic sealing relation to retain the bottom cover on the wafer carrier. The rim portions 78–81 of the bottom cover and the rim portions 45–48 of the wafer carrier comprise the sole means by which the bottom cover is retained on the wafer carrier, i.e., there need be no supplemental latching means for holding the bottom cover on the carrier.

The hermetic seal between the carrier 16 and the top and bottom covers 17, 18 prevents movement of air, other gases, moisture and particles into and out of the container 15, and prevents the carrier from burping or sucking as atmospheric pressures change.

The bottom cover 18 also has a pair of elongate tab portions 82, 83 extending longitudinally along one of the side edge portions 72 and adjacent the rim portion 79 of the bottom cover. The tab portions 82, 83 lie adjacent, but in offset relation, with respect to the adjacent tab 40 on the lower side edge portion of the wafer carrier so as to facilitate a person simultaneously engaging and squeezing both of the tab portions 83 and 40 and assuring that the snap fit has been completed in applying the bottom cover onto the carrier. Ordinarily the bottom cover 18 is applied to the carrier by laying the bottom cover 18 on a support table, then the carrier 16 is placed upon the bottom cover and pressed so as to secure the carrier 16 and cover 18 together in a snap fit. If the wafers W are already in the carrier, the wafers will be lifted by the bottom cover 18 off the offset portions 26, 27 of the sidewalls 19, 20.

In removing the bottom cover 18 from the wafer carrier, one corner portion of the bottom cover is flexed, as above described in connection with the top cover, and the bottom cover 18 may thereby be progressively disengaged from the enlarged lower rim portions 45–48 of the wafer carrier for removing the bottom cover. The rim portions 78–81 of the bottom cover engage and embrace the rim portions 45–48 of the wafer carrier and establish a hermetic sealing relation between the bottom cover 18 and the wafer carrier to prevent migration of air, moisture and particulate into or out of the interior 57 of the wafer carrier. Whereas the bottom cover rim portions 78–81 lie substantially in a plane, portions 78.1, 79.1 of the rim portions 78, 79 extending along the side edge portions 72 of the bottom cover, are diverted out of the plane of the remainder of the bottom cover rim portions to conform to the shape of the portions 50 of the rim portions 45, 46 which diverge out of the planes of the rim portions on the wafer carrier and pass over the index notches 49 in the foot panels 30, 31 of the wafer carrier.

The bottom cover 18 also has outwardly protruding lip portions 84 protruding outwardly all around the periphery of the bottom cover except at the tabs 82, 83 to add strength to the bottom cover. Similarly, the top cover 17 has outwardly protruding lip portions 85 protruding outwardly from the edge portions of the top cover all the way around the periphery of the top cover except at the tabs 70, 71 to provide additional strength to the top cover.

The lip portions 85 which extends along the rim portion 66 and the side edge portion, engages the tab 37 of carrier 16 as the top cover is tilted upward during removal, and assists in lifting and disengaging rim portion 66 from rim portion 41 of the carrier.

FIGS. 10–14 illustrate the shipping container 15 packaged in clusters for shipment so as to deliver semiconductor wafers W for processing. The package is indicated in general by numeral 84 and comprises a multiplicity of cover trays 85 assembled in nesting and stacked relation to each other. The cover trays 85 are molded of foamed plastic and particularly, foamed polypropylene, providing cushioning for the containers 15. Of course, other foamed plastics may be substituted to provide the necessary cushioning for the containers 15. The foamed plastic of the trays 85 is capable of absorbing shock in view of the compressibility of the material and the limited resilience thereof. Each of the cover trays has an upper portion 86 and a lower portion 87.

Although FIG. 9 illustrates a stack of nine trays, i.e., eight levels of containers 15, the package 84 may have lesser number for stacked trays. Often only five trays are utilized in such a package 84.

The upper portion 86 of each of the trays 85 has a multiplicity of open top storage compartments 88 arranged in rows and files, and in the form illustrated, each cover tray has 16 storage compartments formed therein. Each of the storage compartments 88 is shaped to receive a single plastic shipping container therein. The compartments 88 are shaped so that the sidewalls 89 thereof have the same shape as the shape of the sidewalls 19 and 20 of the container 15. Similarly, the compartments 88 of the cover trays are shaped so that the end walls 90 thereof are substantially flat as to conform substantially to the shape of the end walls 21, 22 of the carrier 16. The bottom surface 91 of each of the compartments 88 is substantially flat to conform substantially to the flat shape of the side and end edge portions 72, 73 of the bottom cover 18 of each of the containers 15.

The upper portion 86 of each of the cover trays 85 also defines a support shelf 92 adjacent each of the sidewalls 89 for supporting the tab portions 37, 38 of the wafer carrier 16 of each of the containers 15. The upper tabs 37, 38 of the wafer carrier are thereby supported on the upper portion 86 of the cover tray; and each of the containers 15 is thereby suspended from the support shelves 92 in a compartment of the cover tray. As illustrated in FIG. 14, the containers 16 are suspended from the tabs 37, 38 resting upon the support shelves 92 so that the bottom covers 18 are spaced slightly off the bottom surfaces 91 of the compartments 88. As a result, no pressure is applied through the bottom covers onto the wafers contained in the containers 15.

The lower portions 87 of each of the cover trays 85 overlie the upper portions 86 of the cover trays therebelow; and the lower portions 87 of each of the cover trays has a bottom panel 93 forming the bottom surface 91 of the compartments 88, and the bottom panels 93 also overlies the compartments of the trays therebelow. The bottom panels 93 have lower surfaces shaped to conform to the shape of the top covers 17 of the containers 1B, and as seen in FIG. 11, the surfaces 93.1 are also substantially partially cylindrical as are the panels 58 of the top covers 17. The surfaces 93.1 if the bottom panels 93 are spaced from the top covers 17 of the containers 15 so that no pressure is brought to bear on the partially cylindrical panels 58 of the covers 17.

The lower portions 87 of the cover trays define elongate support feet 94 bearing downwardly upon the side edge portions 61, 62 of the covers 17, as particularly seen in FIG. 13. The support feet 94 are formed adjacent both sidewalls 88 of each compartment and bear downwardly against both side edge portions 61, 62 of each cover 17, and extend all along the length of the covers and of the side edge portions 61, 62. The cover trays 85 thereby bear down on the side edge portions 61, 62 of all of the containers 15 as to continuously hold the covers tightly onto the wafer carriers 16 and maintain the top covers 17 in hermetic sealing relation with the wafer carriers 16.

In order to provide for nesting of the cover trays together and stacking of the trays one upon the other while maintaining the trays in vertical alignment as illustrated in FIG. 9, the upper portions 86 of the cover trays and the lower portions 87 of the cover trays both have interfitting offsets 95 and 96. When the cover trays are stacked one upon the other, the offsets 95 and 96 fit together and prevent any sideward movement of the trays, thereby maintaining the trays in vertical alignment as illustrated in FIGS. 9, 11 and 12.

After the trays have been filled with containers 15 in all of the compartments, and the trays have been stacked one upon the other as illustrated in FIG. 9, the entire column of trays is preferably provided with a shrink wrapping 97 as to secure all of the trays together. Such shrink wrapping is simply a wrapping of plastic film which is subjected to heat and thereby shrunk to grip the trays tightly.

The stack of trays or package 84 may be supported by its own pallet 98. The package 84 may be assembled with a number of other identical packages 84 in a cluster and supported on a pallet 98. The assembled packages 84 are then shrink wrapped for stability and ease of handling.

It will be recognized that because the containers 15 are supported from their tabs 37, 38 on the shelves 92, the cushioning effect of the foamed polypropylene plastic material in the cover trays is utilized for producing individual cushioning for each container. In the event that the entire package 84 is subjected to some physical shock, the transfer of the shock to the wafer carriers within the containers 15 is minimal. Even though the bottom covers 18 of the container may temporarily engage the bottom surfaces 91 of the compartments 88, the wafer carriers are held in spaced relation to the partially cylindrical panels 75 of the bottom cover by the elongate beads or ridges 77, again providing additional cushioning to prevent the wafers from being damaged within the containers 15. The entire clusters of packages 84 as illustrated in FIG. 9 may also be shrink wrapped together on the pallet 98. After the containers have arrived at their destination, they may be cleaned and reused.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

We claim:

1. A package for shipping semiconductor wafers comprising
   a multiplicity of shipping containers confining and engaging such semiconductor wafers and supporting and maintaining the wafers spaced from each other, each of the containers being closed to isolate the confined wafers against contamination,
   a plurality of stacked and nesting cover trays molded of cushioning foamed plastic and comprising upper portions having open top storage compartments each receiving and conforming to the shape of a single said shipping container, the cover tray supporting the shipping containers in the compartments, the cover trays comprising upper and lower faces with interfitting nesting deformations formed therein receiving adjacent cover trays in stacked relation, and
   the cover trays also comprising lower portions having bottom panels underlying the storage compartments to overlie and confine shipping containers in the compartments of a cover tray below the bottom panel.

2. A package for shipping semiconductor wafers according to claim 1 wherein each of the shipping containers comprising a wafer carrier having enclosing walls with upper edge portions defining a top opening of the carrier, a top cover closing said top opening and comprising a central retainer portion confronting the edges of the wafers in the carrier, the top cover also comprising side edge portions lying on the upper edge portions of the enclosing walls, and each of the cover trays comprising support feet adjacent the bottom panels and bearing downwardly on the side edge portions of the top covers.

3. A package for shipping semiconductor wafers according to claim 2 wherein the bottom panels of the cover trays being spaced from the central retainer portions of the top covers.

4. A package for shipping semiconductor wafers according to claim 2 wherein the top covers are molded of substantially stiff but resiliently yieldable plastic, the central retainer portion of the top covers are partially cylindrically shaped, defining convex inner surfaces confronting the top opening of the wafer carrier, the convex inner surfaces having elongate beads extending longitudinally thereof to engage the edges of the wafers stored in the carrier.

5. A package for shipping semiconductor wafers according to claim 1 wherein each of the shipper containers comprising a wafer carrier having enclosing walls with upper edge portions defining a top opening of the carrier, a top cover closing said top opening and lying on the upper edge portions of the enclosing walls, a pair of said enclosing walls of the carrier being opposite each other and comprising outwardly projecting support tabs adjacent said upper edge portions, and said upper portions of the cover trays comprising support shelves adjacent each of the storage compartments, the support shelves engaging and supporting the support tabs of the carriers for suspending the shipping containers in said storage compartments.

6. A package according to claim 5 wherein the upper portions of said cover trays defining bottom surfaces of the storage compartments, the shipping containers being spaced from said bottom surfaces.

7. A package according to claim 6 wherein the foamed plastic of the cover trays is compressible to absorb physical shocks.

8. A package according to claim 6 wherein the shipping container comprises a wafer carrier molded of substantially rigid plastic and having sidewalls with offsets to support the wafers, each of the shipping containers having a bottom cover formed of substantially stiff resiliently yieldable plastic, the bottom cover supporting the wafers and lifting the wafers off the offsets of the sidewalls.

9. A package according to claim 8 wherein the bottom covers of the shipping containers have partially cylindrical panels with elongate convex surfaces facing the interiors of the wafer carriers, each of said partially cylindrical panels having a pair of elongate beads formed integrally thereof and extending along and on the convex surfaces for supporting the wafers.

10. A package for shipping semiconductor wafers comprising:
    a multiplicity of shipping containers, each shipping container having a top and a bottom cover, the shipping containers engaging such semiconductor wafers and supporting and maintaining the wafers spaced from each other, each of the containers being closed to isolate the wafers from contamination;
    a plurality of stacked cover trays molded of foamed plastic, each cover tray
    comprising a top and a bottom, an upper portion adjacent to the top of the cover tray having open top storage compartments, the top storage compartment having a size of a single said shipping container, a shipping container support in each compartment, each of the open top storage compartments surrounding and supporting one shipping container; and
    a lower portion on each of the cover trays adjacent to the bottom of the cover tray, the lower portion having a bottom panel, the bottom panel having a bottom surface in the top storage compartment and a surface spaced from the bottom surface, the top of the shipping container in an adjacently lower stacked cover tray overlaid by the surface spaced from the bottom surface.

11. The invention of claim 10 the shipping container support further comprising a plurality of tabs extending outwardly from each shipping container, a support shelf in each top storage compartment to align with and engage the tabs on the shipping container.

12. The invention of claim 11 wherein the bottom of the shipping container is spaced relative to the bottom surface of the bottom panel.

13. The invention of claim 10 each stacked cover tray further comprising side edge portions, support feet extending from the lower portion of each of the stacked cover trays adjacent the side edge portions and intermediate to adjacent bottom panels of the lower portion.

14. The invention of claim 10 further comprising an offset formed on the bottom of the stacked cover tray adjacent the side edge portion.

15. The invention of claim 14 further comprising an offset formed on the top of the stacked cover tray, the offset in the top of the stacked cover tray aligned with and interfitting with the offset in the bottom of an adjacently stacked cover tray to prevent sideward movement of a stacked cover tray with respect to adjacent stacked cover trays.

16. The invention of claim 13 wherein the support feet are spaced with relation to the bottom panel of the lower portion of the stacked cover tray to engage the cover of the shipping container whereby the shipping container is held closed by the support feet.

17. The invention of claim 10 further comprising wrapping around the plurality of stacked cover trays to hold the stacked cover trays in a fixed relation to each other.

18. The invention of claim 10 further comprising a plurality of elongate beads on the bottom cover of the shipping container supporting the semiconductor wafers.

19. A package for shipping semiconductor wafers comprising:

a plurality of cover trays molded of compressible foamed plastic, each cover tray having an upper portion, a lower portion and side edge portions, a nesting offset formed in the upper portion and a nesting offset formed in the lower portion, a plurality of top storage compartments in the upper portion, a plurality of bottom panels in the lower portion adjacent each top storage compartment, a support foot extending from the lower portion adjacent each bottom panel, the cover trays stacked having the lower portion of an upper cover tray on the upper portion of an adjacent lower cover tray, the offsets of the upper portion of the lower cover tray and lower portion of the upper cover tray interfitting with each other, a support shelf in each storage compartment;

a shipping container in each storage compartment, each shipping container having a top and bottom, each shipping container supported by the support shelf in the storage compartment, the bottom of each shipping container spaced from the bottom panel in the cover tray;

a pallet supporting the cover trays; and a wrapping securing the cover trays to each other and the pallet.

* * * * *

UNITED STATES PATENT AND TRADEMARK OFFICE
CERTIFICATE OF CORRECTION

PATENT NO. : 5,642,813
DATED : July 1, 1997
INVENTOR(S) : Nyseth, David L.

It is certified that error appears in the above-indentified patent and that said Letters Patent is hereby corrected as shown below:

Column 8, line 40, delete "1B", and substitute --15--.

Signed and Sealed this

Twenty-third Day of December, 1997

Attest:

BRUCE LEHMAN

*Attesting Officer*  *Commissioner of Patents and Trademarks*